(12) United States Patent
Wang et al.

(10) Patent No.: US 12,188,970 B2
(45) Date of Patent: Jan. 7, 2025

(54) NEAR-FIELD TESTING APPARATUS FOR TESTING ANTENNA ARRAY AND RELATED METHOD

(71) Applicant: TRON FUTURE TECH INC., Hsinchu (TW)

(72) Inventors: Yu-Jiu Wang, Hsinchu (TW); Li Han Chang, Hsinchu (TW)

(73) Assignee: TRON FUTURE TECH INC., Hsinchu (TW)

( * ) Notice: Subject to any disclaimer, the term of this patent is extended or adjusted under 35 U.S.C. 154(b) by 475 days.

(21) Appl. No.: 17/475,245

(22) Filed: Sep. 14, 2021

(65) Prior Publication Data

US 2022/0099722 A1    Mar. 31, 2022

Related U.S. Application Data

(60) Provisional application No. 63/083,347, filed on Sep. 25, 2020.

(51) Int. Cl.
*G01R 29/10* (2006.01)
*H01Q 3/26* (2006.01)
(Continued)

(52) U.S. Cl.
CPC ............. *G01R 29/10* (2013.01); *H01Q 3/267* (2013.01); *H04B 17/0085* (2013.01); *H04B 17/101* (2015.01); *H04B 17/12* (2015.01)

(58) Field of Classification Search
CPC .... G01R 29/10; H01Q 3/267; H04B 17/0085; H04B 17/101; H04B 17/12; H04B 17/104
See application file for complete search history.

(56) References Cited

U.S. PATENT DOCUMENTS

| 5,270,723 A | * | 12/1993 | Lopez | H01Q 3/267 |
| | | | | 343/703 |
| 9,891,266 B2 | * | 2/2018 | Wang | G01R 31/3025 |
| 2020/0280129 A1 | | 9/2020 | Miers et al. | |

FOREIGN PATENT DOCUMENTS

| CN | 107490729 A | | 12/2017 |
| KR | 20160099589 A | * | 8/2016 |
| WO | 2019226426 A1 | | 11/2019 |

OTHER PUBLICATIONS

Office Action, Cited Reference and Search Report dated May 6, 2022 issued by the Taiwan Intellectual Property Office for the Taiwanese Counterpart Application No. 110134282.

(Continued)

*Primary Examiner* — Feba Pothen
(74) *Attorney, Agent, or Firm* — WPAT, P.C.; Anthony King

(57) ABSTRACT

A near-field testing apparatus for testing a device under test having an array of transmitter antennas is provided. The near-field testing apparatus includes a frame structure and a receiver circuit. The frame structure defines an array of grid sections, and is arranged for receiving the array of transmitter antennas at a first side of the array of grid sections. A periphery of each grid section at the first side surrounds a plurality of transmitter antennas in the array of transmitter antennas. The grid section is arranged to guide respective electromagnetic signals emitted by the transmitter antennas from the first side to a second side of the array of grid sections. The receiver circuit, disposed at the second side of the array of grid sections, is arranged to couple the electromagnetic signals out of the grid section.

20 Claims, 13 Drawing Sheets

(51) Int. Cl.
*H04B 17/00* (2015.01)
*H04B 17/10* (2015.01)
*H04B 17/12* (2015.01)

(56) References Cited

OTHER PUBLICATIONS

English Abstract Translation of CN107490729A.

* cited by examiner

NEAR-FIELD TESTING APPARATUS FOR TESTING ANTENNA ARRAY AND RELATED METHOD

PRIORITY CLAIM AND CROSS-REFERENCE

The present application claims priority to U.S. Provisional Patent Application No. 63/083,347, filed on Sep. 25, 2020, which is incorporated by reference herein in its entirety.

BACKGROUND

The present disclosure relates to antenna arrays and, more particularly, to a near-field testing apparatus for testing a device under test (DUT) having an array of antennas, a near-field testing grid, and a method for testing a DUT having an array of antennas.

Phased array technology has been widely used in military applications and communication systems, such as aircraft radars and satellites. A phased array system includes a plurality of antennas arranged in an array, where input power and relative phasing of each antenna are controlled to steer the radiation pattern or beam. As the radiation pattern can be electronically steered in various directions, the phased array system can direct the beam at high speed. The phased array system can have small size, light weight and low power consumption in comparison with a mechanically steered antenna. In addition, the phased array system plays an important role in advanced wireless communication such as 5G wireless applications because of the ability to shape, switch, or scan the propagating beam.

SUMMARY

The described embodiments provide a near-field testing apparatus for testing a device under test (DUT) having an array of antennas, a near-field testing grid, and a method for testing a DUT having an array of antennas.

Some embodiments described herein may include a near-field testing apparatus for testing a device under test (DUT) having an array of transmitter antennas. The near-field testing apparatus includes a frame structure and a receiver circuit. The frame structure defines an array of grid sections, and is arranged for receiving the array of transmitter antennas at a first side of the array of grid sections. A periphery of each grid section at the first side surrounds a plurality of transmitter antennas in the array of transmitter antennas. The grid section is arranged to guide respective electromagnetic signals emitted by the transmitter antennas from the first side to a second side of the array of grid sections. The receiver circuit, disposed at the second side of the array of grid sections, is arranged to couple the electromagnetic signals out of the grid section.

Some embodiments described herein may include a near-field testing grid. The near-field testing grid includes a first opening, a second opening, and a guiding region. The first opening is configured to mount a plurality of transmitter antennas. The second opening is configured to mount a plurality of receiver antennas. The guiding region is configured to be a hollow core region of a hollow waveguide structure between the first opening and the second opening, and arranged to guide respective electromagnetic signals emitted by the transmitter antennas to the receiver antennas. The electromagnetic signals are transmitted in a form of standing wave in the hollow waveguide structure.

Some embodiments described herein may include a method for testing a device under test (DUT) having an array of transmitter antennas. The method includes: covering a plurality of transmitter antennas in the array of transmitter antennas with a waveguide structure by placing the DUT in a frame structure defining a plurality of waveguide structures; utilizing the waveguide structure to guide electromagnetic signals emitted by the transmitter antennas from a first side of the frame structure to a second side of the frame structure opposite to the first side; and coupling the electromagnetic signals out of the waveguide structure and accordingly generate respective test results of the transmitter antennas.

With the use of the proposed testing scheme, an array of antennas can be tested using near-field coupling operation which can reduce/eliminate OTA path loss produced in near-field test operation. An array of shells can be provided to reduce energy leakage and interference between different antennas. In addition, the proposed testing scheme can speed up the process of testing an antenna module by testing one group of subunits at a time.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
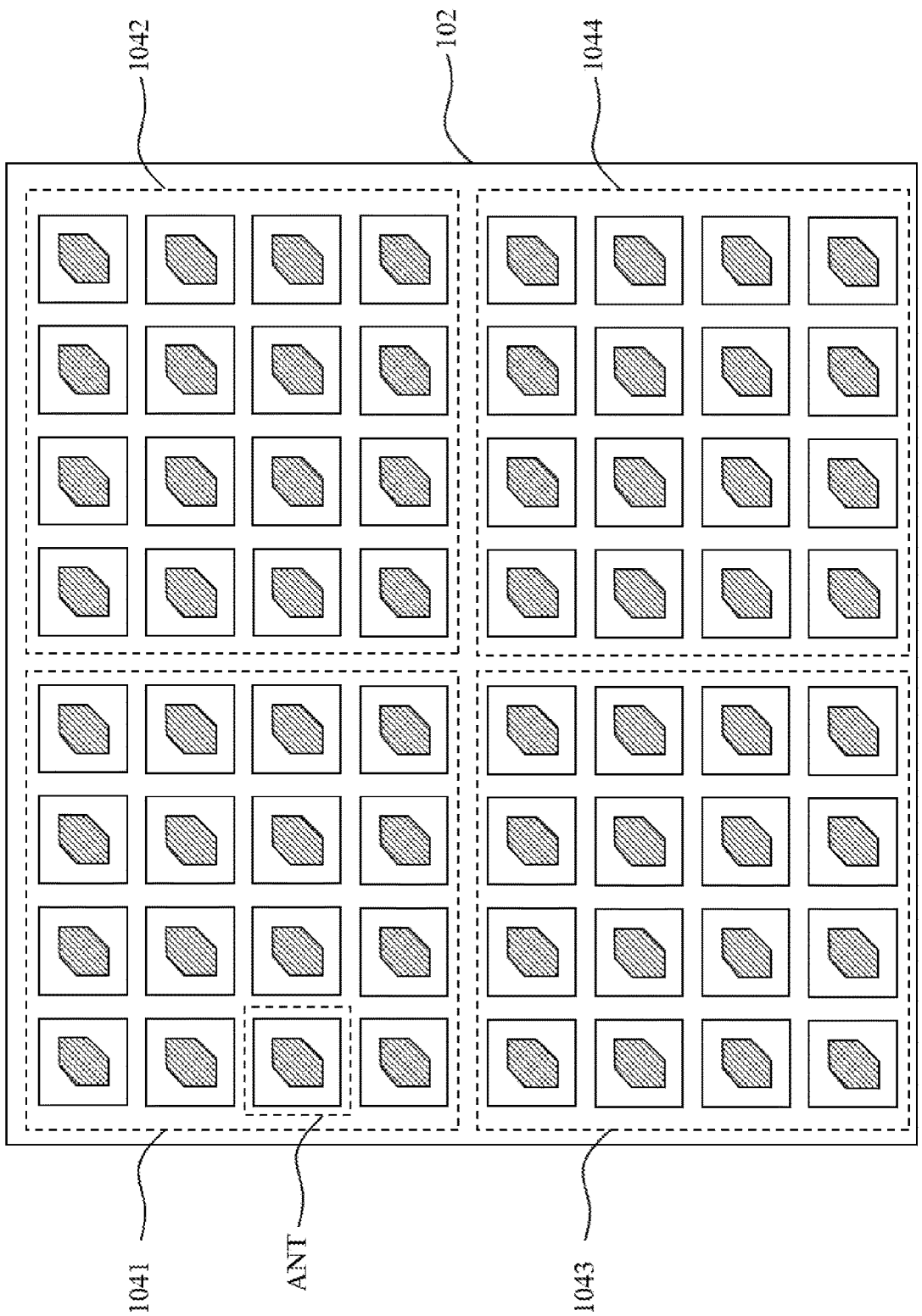
FIG. 1 is a diagram illustrating an exemplary antenna module in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, parameter values in the description that follows may vary depending on a given technology node. As another example, parameter values for a given technology node may vary depending on a given application or operating scenario. In addition, the present disclosure may repeat reference numerals and/or letters in the various examples. This repetition is for the purpose of simplicity and clarity and does not in itself dictate a relationship between the various embodiments and/or configurations discussed.

Further, it will be understood that when an element is referred to as being "connected to" or "coupled to" another element, it may be directly connected to or coupled to the other element, or intervening elements may be present.

In order to achieve high directivity or deliver sufficiently high signal power, a phased array system may have a large number of subunits installed therein. Each subunit can serve as a transmitter for transmitting or emitting an electromagnetic (EM) wave or a radio frequency (RF) signal, or serve as a receiver for receiving an EM wave or an RF signal. FIG. 1 is a diagram illustrating an exemplary antenna module in accordance with some embodiments of the present disclosure. The antenna module 102 includes a plurality of subunits ANT, each of which includes an antenna and associated circuit elements. The signal power and relative phase of each subunit ANT are supposed to be tested before the antenna module 102 is installed in a phased array radar system. However, it would take a lot of test time and increase production costs because of the large number of subunits.

The present disclosure describes exemplary near-field testing apparatuses, each of which can be configured to speed up the process of testing an antenna module by testing one group of subunits at a time. For example, the antenna module 102 can be divided into groups of subunits 1041-1044, each of which includes a 4×4 array of subunits. The exemplary near-field testing apparatus may test one group of subunits included in the antenna module 102 at a time. Testing of the groups of subunits 1041-1044 may be automatically completed by a machine and/or a computer. Additionally, or alternatively, the exemplary near-field testing apparatus can include a frame structure used for receiving a device under test (DUT) having an array of antennas, such as a group of subunits. The frame structure can define an array of grid sections or an array of waveguide structures to perform near-field coupling, thereby rapidly test the signal power of and relative phases among antennas in each array of antennas. Further description is provided below.

Figure 2A:
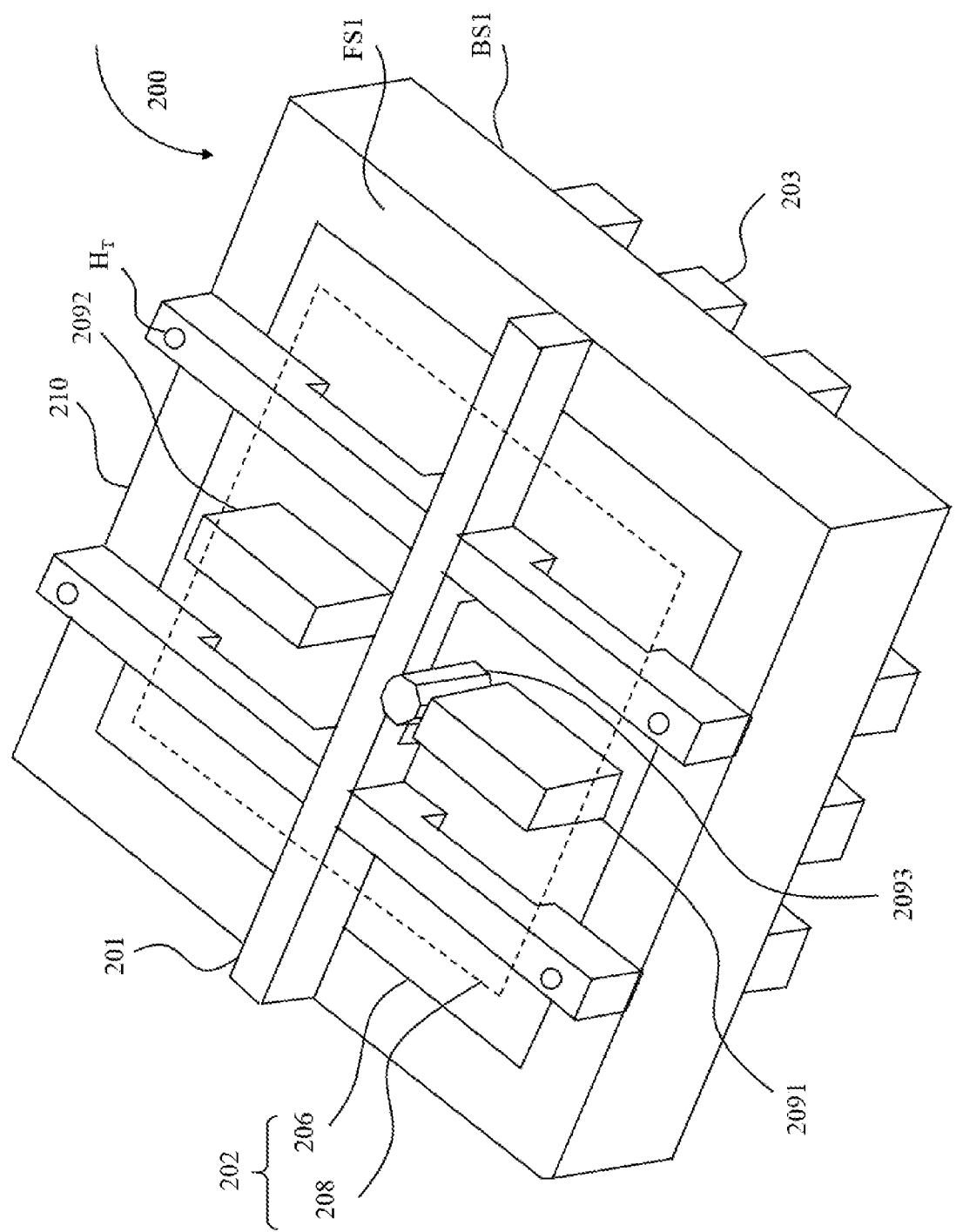
FIG. 2A is a diagram illustrating an exemplary near-field testing apparatus in accordance with some embodiments of the present disclosure.

FIG. 2A is a diagram illustrating an exemplary near-field testing apparatus in accordance with some embodiments of the present disclosure. The near-field testing apparatus 200 is configured to test a DUT 202 which is received therewithin. The DUT 202 can be implemented using one of the groups of subunits 1041-1044 shown in FIG. 1. In other words, the near-field testing apparatus 200 can be configured to test one or more groups of subunits included in the antenna module 102 shown in FIG. 1.

The DUT 202 includes a substrate 206, a front-end circuit 208 and an array of antennas (not shown in FIG. 2A). The front-end circuit 208 and the array of antennas are disposed on opposite sides of the substrate 206, respectively. The front-end circuit 208 may include, but is not limited, phase shifters, power amplifiers, and/or other types of RF front-end circuit elements (not shown in FIG. 2A). In addition, pin connectors 2091 and 2092 can be disposed on the substrate 206 for direct current (DC) power and logic interconnection. An RF connector 2093 can be disposed on the substrate 206 for RF interconnection.

The near-field testing apparatus 200 includes, but is not limited to, a transmitter jig 201, a receiver jig 203, a frame structure 210 and a receiver circuit (not shown in FIG. 2A). The transmitter jig 201 can be arranged to attach the DUT 202 to the frame structure 210. By way of example but not limitation, the transmitter jig 201 may include holes $H_T$ which allow screws or bolts to be threaded into corresponding holes of the frame structure 210 (not shown in FIG. 2A), thereby fixing the DUT 202 to a side FS1 of the frame structure 210. Similarly, the receiver jig 203 can be arranged to attach the receiver circuit to an opposite side BS1 of the frame structure 210.

It is worth noting that, when the DUT 202 is received within or mounted to the near-field testing apparatus 200, the frame structure 210 and the receiver circuit can seal or surround the array of antennas included in the DUT 202 to thereby perform near-field coupling to transmit the energy outputted from the array of antennas. By way of example but not limitation, the frame structure 210 can implement an array shell to confine an electromagnetic signal outputted from an antenna of the DUT 202 to propagate along a path between the antenna and the receiver circuit. The receiver circuit can be configured to couple the electromagnetic signal out of the array shell to thereby perform near-field coupling.

Figure 2B:
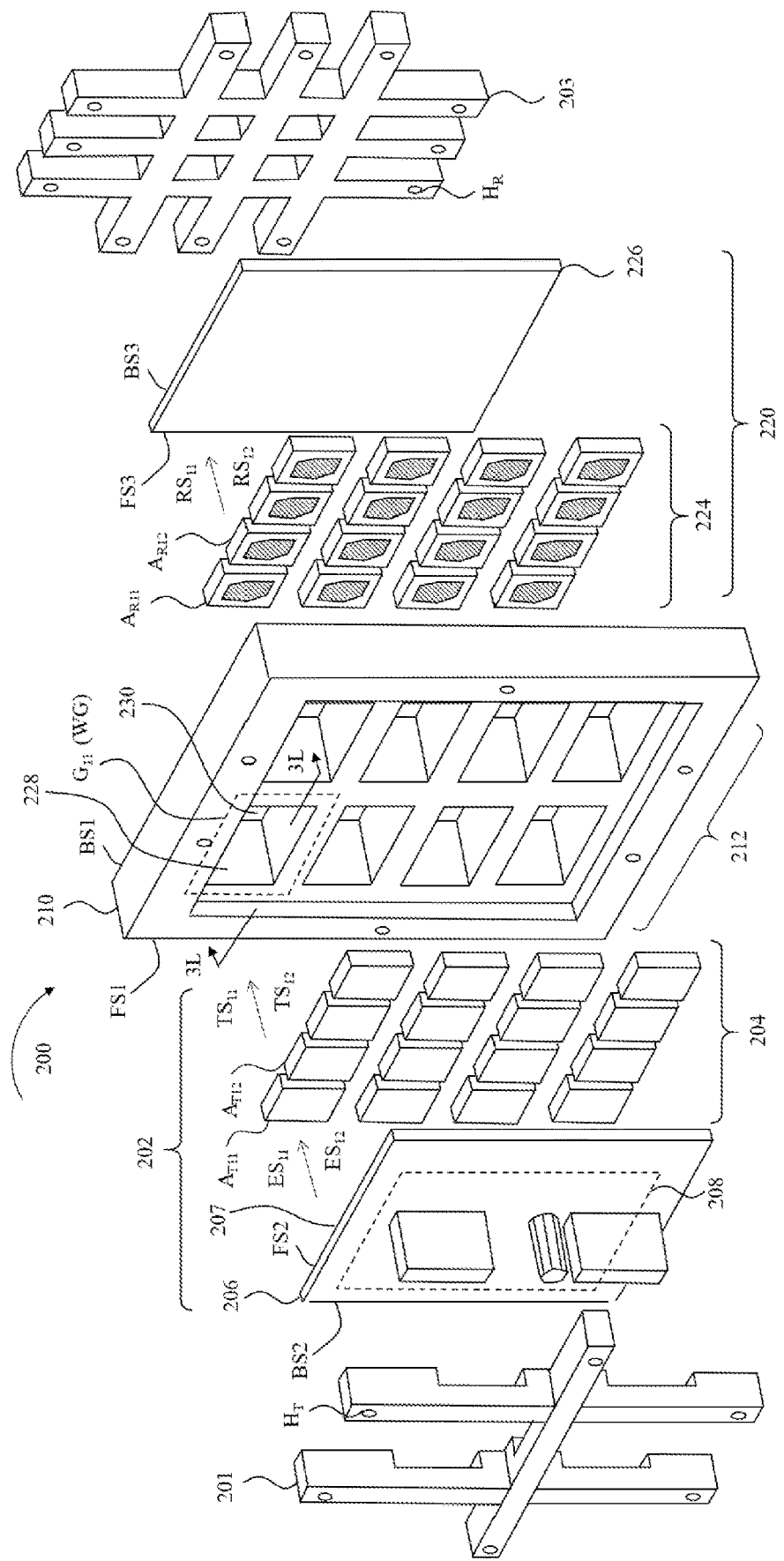
FIG. 2B is an exploded view of the near-field testing apparatus shown in FIG. 2A in accordance with some embodiments of the present disclosure.

FIG. 2B illustrates an exploded view of the near-field testing apparatus 200 shown in FIG. 2A is illustrated in accordance with some embodiments of the present disclosure. FIG. 2B further illustrates an exploded view of the DUT 202 shown in FIG. 2A in accordance with some embodiments of the present disclosure. Referring to FIG. 2B, an array of antennas 204 of the DUT 202 is disposed on a side FS2 facing the side FS1 of the frame structure 210 when the DUT 202 is received within or mounted to the near-field testing apparatus 200. The front-end circuit 208 is disposed on a side BS2 of the substrate 206 opposite to the side FS2. As the array of antennas 204 can be configured to send out one or more electromagnetic signals in the testing process, each antenna in the array of antennas 204 can be referred to as a transmitter antenna.

Figure 2C:
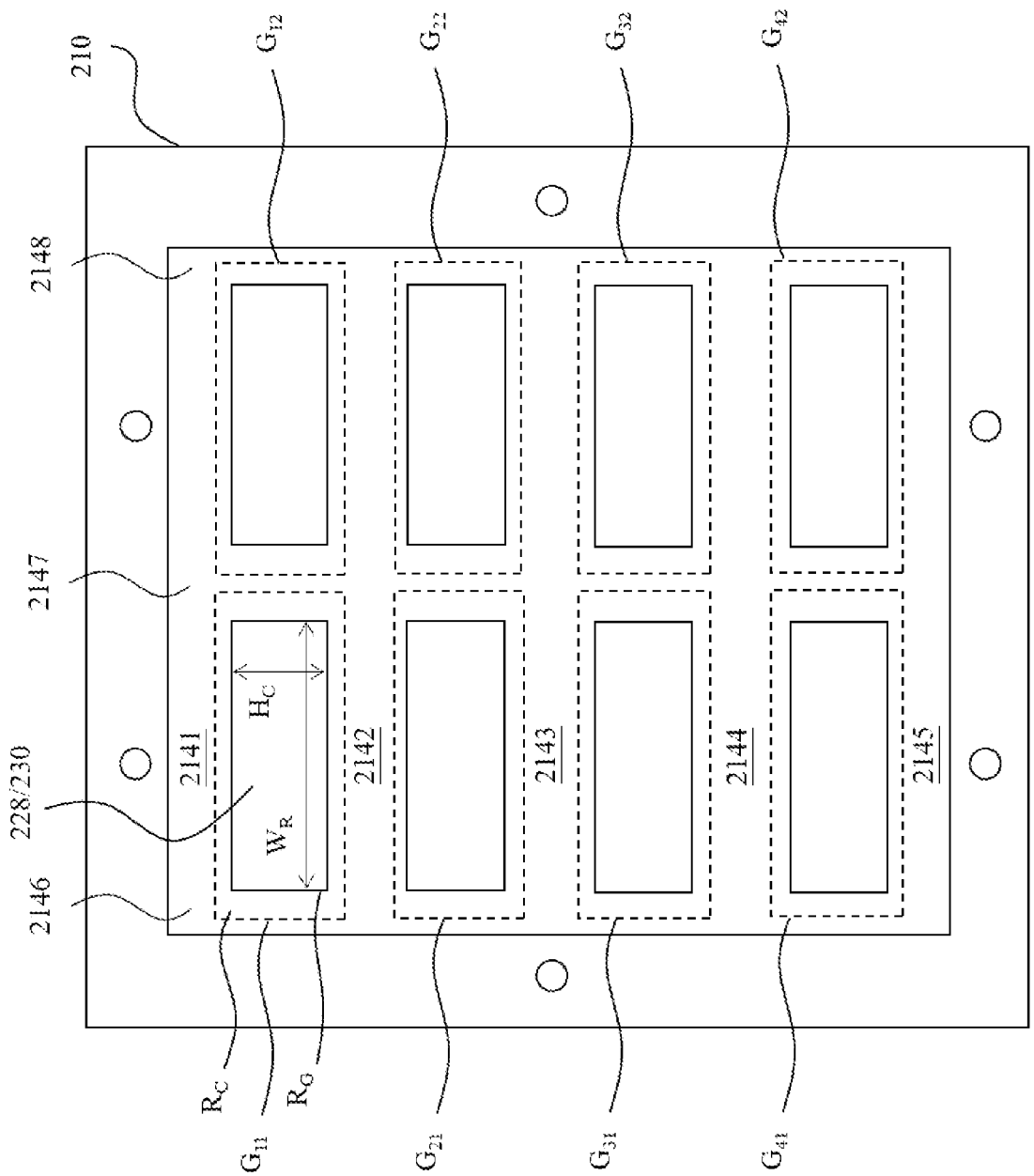
FIG. 2C is a front view of the frame structure shown in FIG. 2B in accordance with some embodiments of the present disclosure.

The frame structure 210 can define an array of grid sections 212, i.e. a plurality of grid sections $G_{11}$-$G_{42}$ arranged in rows and columns shown in FIG. 2C. The frame structure 210 is arranged to receive the DUT 202 at a side of the array of grid sections 212, i.e. the side FS1 of the frame structure 210. When the DUT 202 is received within or mounted to the frame structure 210, as shown in FIG. 2A, a periphery of each grid section at the side FS1 is arranged to surround a group of antennas in the array of antennas 204. The grid section can serve as a waveguide structure to guide a group of electromagnetic signals, generated by the surrounded group of antennas, from the side FS1 to the side BS1, i.e. an opposite side of the array of grid sections 212.

In the present embodiment, when the DUT 202 is received within or mounted to the frame structure 210, a periphery of the grid section $G_{11}$ can surround two adjacent antennas $A_{T11}$ and $A_{T12}$ arranged in a row direction or a column direction. Referring to FIG. 2B and FIG. 2C, the grid section $G_{11}$ can serve as a waveguide structure WG, which includes a guiding region $R_G$ and a cladding region $R_C$ surrounding the guiding region $R_G$.

More specifically, the grid section $G_{11}$ is a near-field testing grid configured to be a waveguide structure (e.g. the waveguide structure WG). The grid section $G_{11}$ comprises a first opening 228, a second opening 230, and the guiding region $R_G$ that is surrounded by the cladding region $R_C$. The second opening 230 is opposite to the first opening 228. The first opening 228 is arranged to be mount the two adjacent antennas $A_{T11}$ and $A_{T12}$ when the DUT 202 is received within the frame structure 210 from the side FS1. The second opening 230 is arranged to be mount two adjacent antennas $A_{R11}$ and $A_{R12}$ of the receiver circuit 220 when the receiver circuit 220 is received within the frame structure 210 from the side BS1. Accordingly, the antennas $A_{T11}$ and $A_{T12}$ are directly opposite to the antennas $A_{R11}$ and $A_{R12}$ in the grid section $G_{11}$ respectively. The guiding region $R_G$ is configured to be a hollow core region of a hollow waveguide structure between the first opening 228 and the second opening 230. In this embodiment, the hollow waveguide structure is a rectangular hollow structure, the first opening 228 is a first rectangular opening, and the second opening 230 is a second rectangular opening opposite to the first rectangular opening. However, this is not a limitation of the present disclosure. The hollow waveguide structure, or the guiding region $R_G$, is arranged to guide respective electromagnetic signals emitted by the antennas $A_{T11}$ and $A_{T12}$ to the antennas $A_{R11}$ and $A_{R12}$. The electromagnetic signals are transmitted in a form of standing wave in the hollow waveguide structure.

Figure 7A:
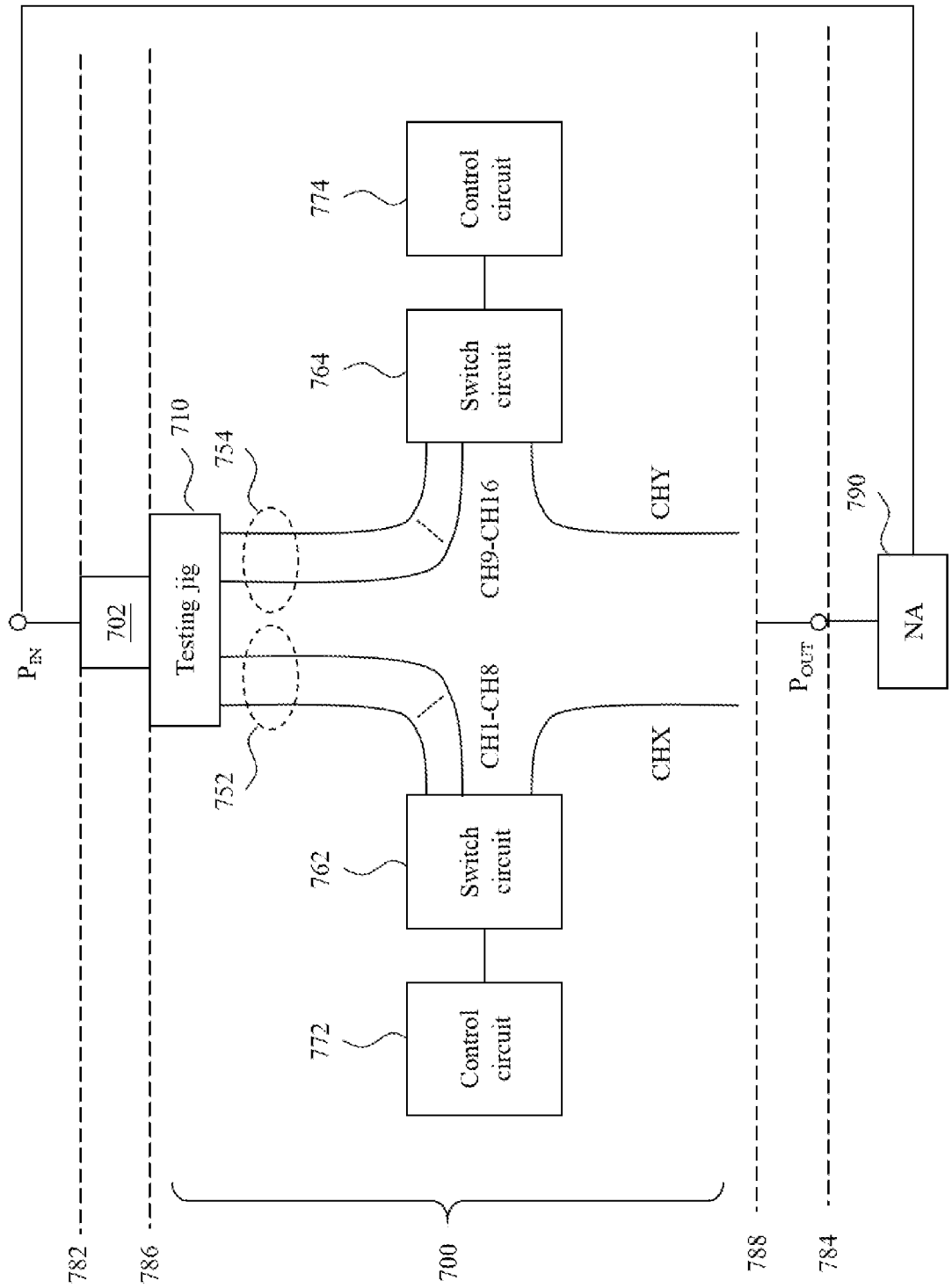
FIG. 7A is a block diagram representation of the near-field testing apparatus shown in FIG. 6A used in the calibration process in accordance with some embodiments of the present disclosure.
Figure 7B:
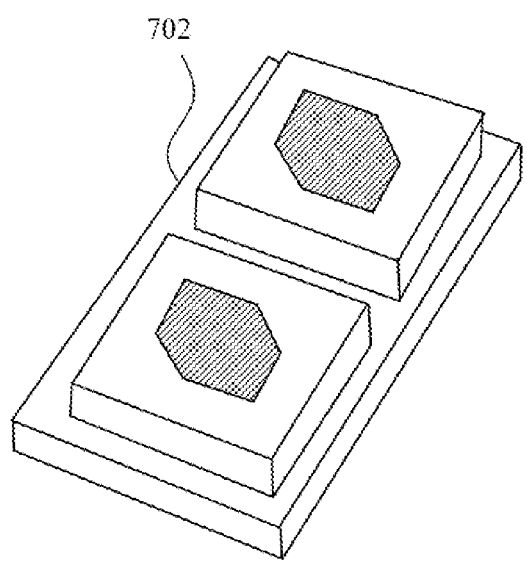
FIG. 7B is an implementation of the calibration module shown in FIG. 7A in accordance with some embodiments of the present disclosure.

Moreover, the two adjacent antennas $A_{T11}$ and $A_{T12}$ are arranged in a first row with a first rectangular shape (e.g. the shape as shown in FIG. 7B), and the two adjacent antennas $A_{R11}$ and $A_{R12}$ are arranged in a second row with a second rectangular shape (e.g. the shape as shown in FIG. 7B). An area of the first rectangular shape is not greater than an area of the first rectangular opening (e.g. a cross-sectional area of the first opening 228), and an area of the second rectangular shape is not greater than an area of the second rectangular opening (e.g. a cross-sectional area of the second opening 230), such that the antennas $A_{T11}$ and $A_{T12}$ and the antennas $A_{R11}$ and $A_{R12}$ can be mounted into the opposite sides of the grid section $G_{11}$ respectively.

In some embodiments, an inner height $H_C$ of a cross section of the rectangular hollow structure (i.e. a height of a cross section of the guiding region $R_G$) is equal to a half wavelength of at least one of the electromagnetic signals, and an inner width $W_R$ of the cross section of the rectangular hollow structure (i.e. a width of the cross section of the guiding region $R_G$) is equal to a wavelength of the at least one of the electromagnetic signals. In some embodiments, the width of the cross section of the guiding region $R_G$ (i.e. the inner width $W_R$) is equal to or greater than two times a length of the antenna $A_{T11}$ in a row direction, and the height of the cross section of the guiding region $R_G$ (i.e. the inner height $H_C$) is equal to or greater than a length of the antenna $A_{T11}$ in a column direction.

When an input signal $ES_{11}$ is fed to the antenna $A_{T11}$, the antenna $A_{T11}$ can couple the input signal $ES_{11}$ into the waveguide structure WG implemented using the grid section $G_{11}$, and accordingly produce an electromagnetic signal $TS_{11}$. The waveguide structure WG can guide the electromagnetic signal $TS_{11}$ from the side FS1 to the side BS1. Similarly, when an input signal $ES_{12}$ is fed to the antenna $A_{T12}$, the antenna $A_{T12}$ can couple the input signal $ES_{12}$ into the waveguide structure WG to thereby produce an electromagnetic signal $TS_{12}$. The waveguide structure WG can guide the electromagnetic signal $TS_{12}$ from the side FS1 to the side BS1.

In the present embodiment, the frame structure 210 includes a plurality of intersecting side walls 2141-2148. Each of the side walls 2141-2145 extends in a row direction, and each of the side walls 2146-2148 extends in a column direction. The side walls 2141-2148 can be arranged to define the array of grid sections 212, and accordingly implement an array of waveguide structures. For example, an inner portion of the grid section $G_{11}$ surrounded by the side walls 2141, 2142, 2146 and 2147 can serve as the guiding region $R_G$ of the waveguide structure WG, and an outer portion of the grid section $G_{11}$ surrounding the inner portion can serve as the cladding region $R_C$ of the waveguide structure WG.

Each waveguide structure of the frame structure 210 can be implemented as a hollow waveguide structure, a dielectric-filled waveguide structure or other types of waveguide structures. For example, the guiding region $R_G$ may be a hollow core region filled with gases, vacuum or liquids. As another example, the guiding region $R_G$ may be filled dielectric materials. As still another example, the cladding region $R_C$ may have an inner conductive surface arranged to surround the guiding region $R_G$. The inner conductive surface may be a metal surface or other types of highly reflective surfaces. In other words, a group of side walls arranged to define the grid section $G_{11}$, i.e. the side walls 2141, 2142, 2146 and 2147, may have conductive surfaces facing each other.

Additionally, or alternatively, the grid sections $G_{11}$-$G_{42}$ may be of a substantially same size to surround or mount a same number of antennas. Waveguide structures implemented using the grid sections $G_{11}$-$G_{42}$ may have a same waveguide size. In the present embodiment, each grid section can be arranged to surround or mount two adjacent antennas for illustrative purposes. In some embodiments, at least one of the grid sections $G_{11}$-$G_{42}$ can be arranged to surround or mount more than two adjacent antennas without departing from the scope of the present disclosure.

The receiver circuit 220, disposed at the side BS1, is arranged to couple a group of electromagnetic signals out of each grid section. The receiver circuit 220 can be regarded as a near-field probe for receiving or coupling the radiation energy of the array of antennas 204. Also, the receiver circuit 220 may generate a group of receiver signals in response to the group of electromagnetic signals, wherein the group of receiver signals can carry power information and/or phase information of a group of transmitter antennas surrounded or mounted by the grid section. For example, the receiver circuit 220 can couple the electromagnetic signals $TS_{11}$ and $TS_{12}$ out of the grid section $G_{11}$, and accordingly generate a plurality of receiver signals $RS_{11}$ and $RS_{12}$. The receiver signal $RS_{11}$ can carry power information and/or phase information of the antenna $A_{T11}$. The receiver signal $RS_{12}$ can carry power information and/or phase information of the antenna $A_{T12}$.

In the present embodiment, the receiver circuit 220 includes an array of antennas 224 and an interposer structure 226. The array of antennas 224 is disposed on a side FS3 of the interposer structure 226 facing the side BS1. When the DUT 202 is received within or mounted to the near-field testing apparatus 200, as shown in FIG. 2A, the array of antennas 224 can be disposed in correspondence with the array of antennas 204, wherein a periphery of each grid section at the side BS1 may surround or mount a plurality of antennas in the array of antennas 224. As a result, the array of antennas 224 can couple a group of electromagnetic signals out of each grid section. By way of example but not limitation, each antenna in the array of antennas 204 and a corresponding antenna in the array of antennas 224 may be placed symmetrically with respect to the frame structure 210. As the array of antennas 224 can be configured to receive one or more electromagnetic signals in the testing process, each antenna in the array of antennas 224 can be referred to as a receiver antenna.

For example, the two adjacent antennas $A_{R11}$ and $A_{R12}$ can be disposed in correspondence with the antennas $A_{T11}$ and $A_{T12}$ respectively in the testing process. A periphery of the grid section $G_{11}$ at the side BS1 can surround or mount the antennas $A_{R11}$ and $A_{R12}$. The antenna $A_{R11}$ can couple the electromagnetic signal $TS_{11}$ out of the grid section $G_{11}$, i.e. the waveguide structure WG, and accordingly produce the receiver signal $RS_{11}$. The antenna $A_{R12}$ can couple the electromagnetic signal $TS_{12}$ out of the grid section $G_{11}$ and accordingly produce the receiver signal $RS_{12}$.

In addition, at least a portion of the side FS3 of the interposer structure 226 can be attached to the side BS1 of the frame structure 210 in the testing process. For example, the receiver jig 203 may include holes $H_R$ which allow screws or bolts to be threaded into corresponding holes on the side BS1, thereby fixing the receiver circuit 220 to the frame structure 210.

With the use of the proposed testing scheme, the near-field testing apparatus 200 can serve as a screening jig, which may be similar to a pogo pin connector configured to transmit the energy. However, the screening jig can transmit the energy outputted from a transmitter antenna by performing near-field coupling upon the transmitter antenna rather than physically contacting the transmitter antenna. In addition, the screening jig can include an array of shells, wherein an electromagnetic signal outputted from a transmitter antenna can be confined to propagate in a corresponding shell surrounding or covering the transmitter antenna. A test result of the transmitter antenna would not be affected by another transmitter antenna.

To facilitate understanding of the present disclosure, some embodiments are given below for further description of the proposed testing scheme. However, this is provided for illustrative purposes, and is not intended to limit the scope of the present disclosure. As long as a near-field testing apparatus utilizes a waveguide structure and an associated receiver circuit to surround or seal or mount a transmitter antenna to thereby perform near-field coupling, associated modifications and alternatives are contemplated to fall within the scope of the present disclosure.

Figure 3A:
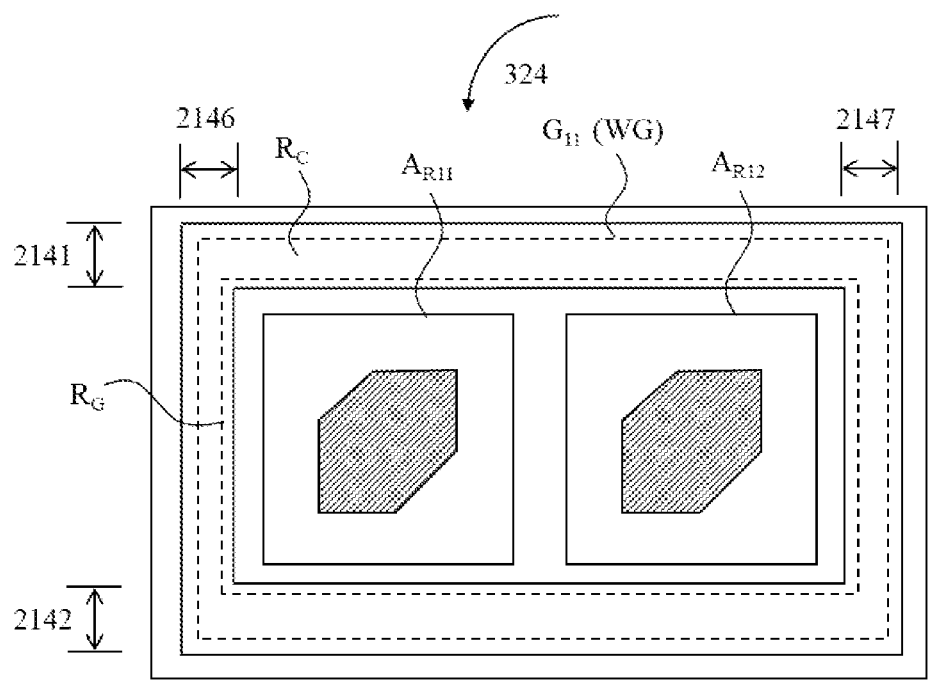
FIG. 3A is a diagram illustrating an exemplary test unit of the near-field testing apparatus in accordance with some embodiments of the present disclosure.

FIG. 3A illustrates an exemplary test unit of the near-field testing apparatus 200 shown in FIG. 2B in accordance with some embodiments of the present disclosure. FIG. 3A can be regarded as a front view of in the direction of lines 3L-3L of FIG. 2B in a case where the frame structure 210, the array of antennas 224 and the interposer structure 226 shown in FIG. 2B are joined together. In the present embodiment, the test unit 324 includes the waveguide structure WG, the antennas $A_{R11}$ and $A_{R12}$, and a portion of the interposer structure 226 where the antennas $A_{R11}$ and $A_{R12}$ are disposed. At an end of the waveguide structure WG where the interposer structure 226 is attached, the antennas $A_{R11}$ and $A_{R12}$ are surrounded by the cladding region $R_C$ such that the test unit 324 can serve as a shell having 1×2 antennas. The shell can prevent energy from leaking or reduce energy leakage. As a result, the shell can eliminate/reduce interference caused by energy coming the outside thereof.

Referring to FIG. 3A and also FIG. 2B, when the DUT 202 is received within or mounted to the near-field testing apparatus 200, the test unit 324 can be arranged to cover the antennas $A_{T11}$ and $A_{T12}$ at the side FS1. For example, the substrate 206 includes a ground plane structure 207 at the side FS2 thereof. The array of antennas 204 can be disposed on the ground plane structure 207. When the DUT 202 is received within or mounted to the near-field testing apparatus 200, at least one of the side walls 2141, 2142, 2146 and 2147 is in contact with the ground plane structure 207, and each of the side walls 2141, 2142, 2146 and 2147 is separated from the antennas $A_{T11}$ and $A_{T12}$. As a result, the cladding region $R_C$ is in contact with the ground plane structure 207 while separated from the antenna $A_{T11}$. The guiding region $R_G$ can cover the antenna $A_{T11}$. When the input signal $ES_{11}$ is fed to the antenna $A_{T11}$, the electromagnetic signal $TS_{11}$ outputted from the antenna $A_{T11}$ can be coupled into and propagate within the test unit 324, i.e. the shell having 1×2 antennas.

Figure 3B:
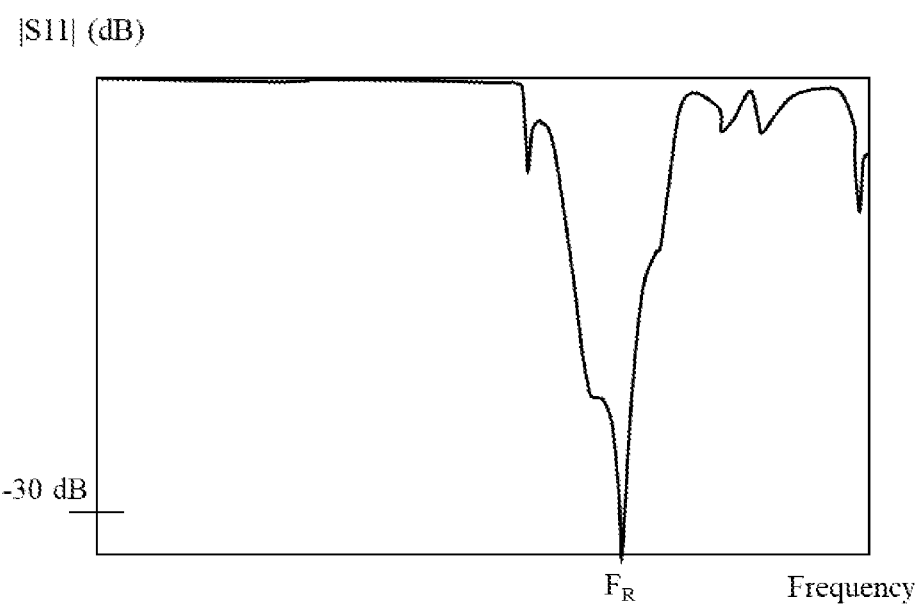
FIG. 3B illustrates the reflection coefficient as a function of frequency for the antenna shown in FIG. 2B in a case where the antenna is covered by the test unit shown in FIG. 3A.

FIG. 3B illustrates the reflection coefficient S11 as a function of frequency for the antenna $A_{T11}$ shown in FIG. 2B in a case where the antenna $A_{T11}$ is covered by the test unit 324 shown in FIG. 3A. In the present embodiment, a resonant frequency of the antenna $A_{T11}$ is substantially equal to the frequency $F_R$, where the reflection coefficient S11 is less than −30 dB. As a result, when the antenna $A_{T11}$ operates at the frequency $F_R$, the input signal $ES_{11}$ can be effectively coupled into the test unit 324. The test unit 324 can serve as a near-field probe for coupling the radiation energy of the antenna $A_{T11}$.

Figure 4A:
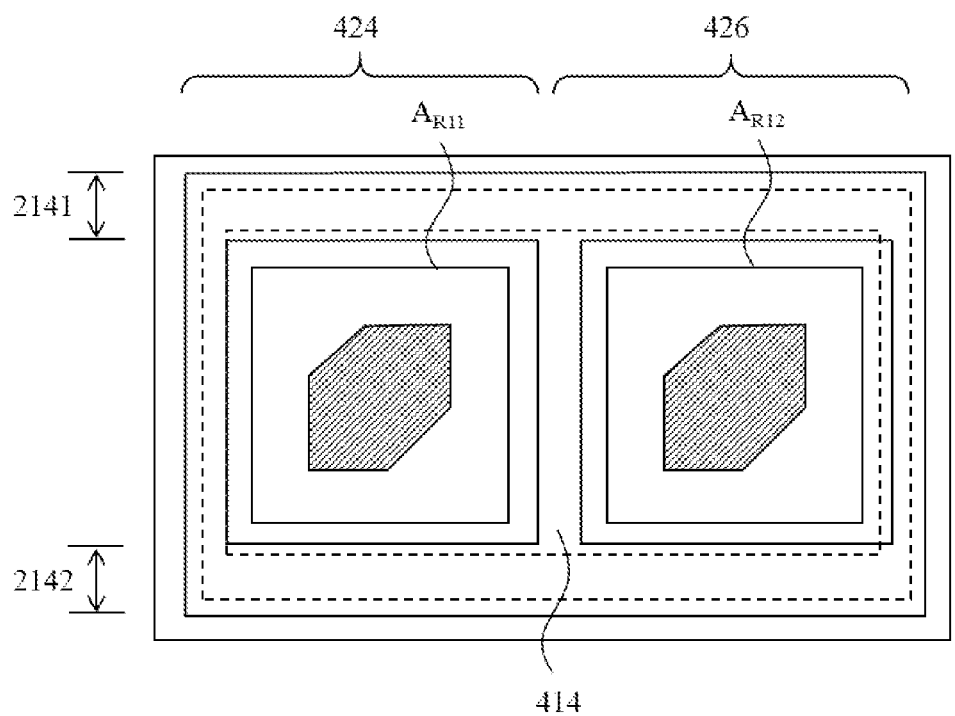
FIG. 4A is a diagram illustrating a shell having 1×1 antenna in accordance with some embodiments of the present disclosure.
Figure 4B:
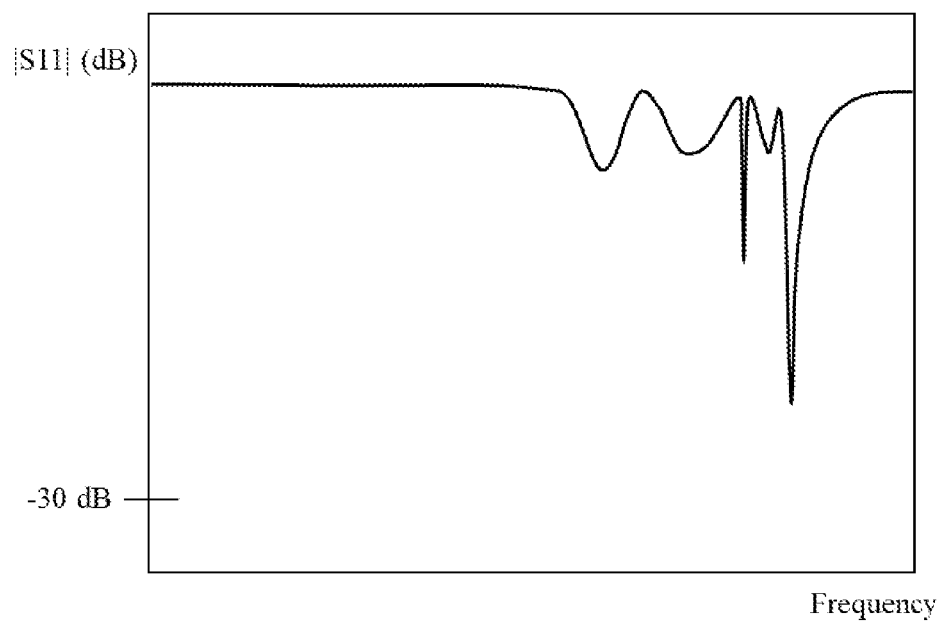
FIG. 4B illustrates the reflection coefficient as a function of frequency for the antenna shown in FIG. 2B in a case where the antenna is covered by the shell shown in FIG. 4A.

In some embodiments where the antennas $A_{T11}$, $A_{T12}$, $A_{R11}$ and $A_{R12}$ are implemented using half-wavelength patch antennas of a same size, the test unit 324 may serve as a minimum unit capable of effectively coupling radiation energy of the antenna $A_{T11}$. For example, referring to FIG. 4A, when a side wall 414 intersecting the side walls 2141 and 2142 is disposed between the antennas $A_{R11}$ and $A_{R12}$ to form two shells 424 and 426 each having 1×1 antenna, the antenna $A_{T11}$ shown in FIG. 2B would be covered by the shell 424. FIG. 4B illustrates the reflection coefficient S11 as a function of frequency for the antenna $A_{T11}$ shown in FIG. 2B in a case where the antenna $A_{T11}$ is covered by the shell 424 shown in FIG. 4A. As shown in FIG. 4B, the reflection coefficient S11 is relatively high compared to that shown in FIG. 3B because of parasitic effects caused by the shell 424. The antenna $A_{T11}$ would not be able to effectively couple the input signal $ES_{11}$ into a waveguide structure defined by the shell 424. For example, the waveguide structure defined by the shell 424 may not allow single-mode operation. Power fed to the antenna $A_{T11}$ would not be successfully coupled into the shell 424. In contrast, when arranged for coupling radiation energy of a transmitter antenna, the shell having 1×2 antenna shown in FIG. 3A can not only effectively couple an input signal of the transmitter antenna thereinto, but also reduce energy leakage.

Figure 5:
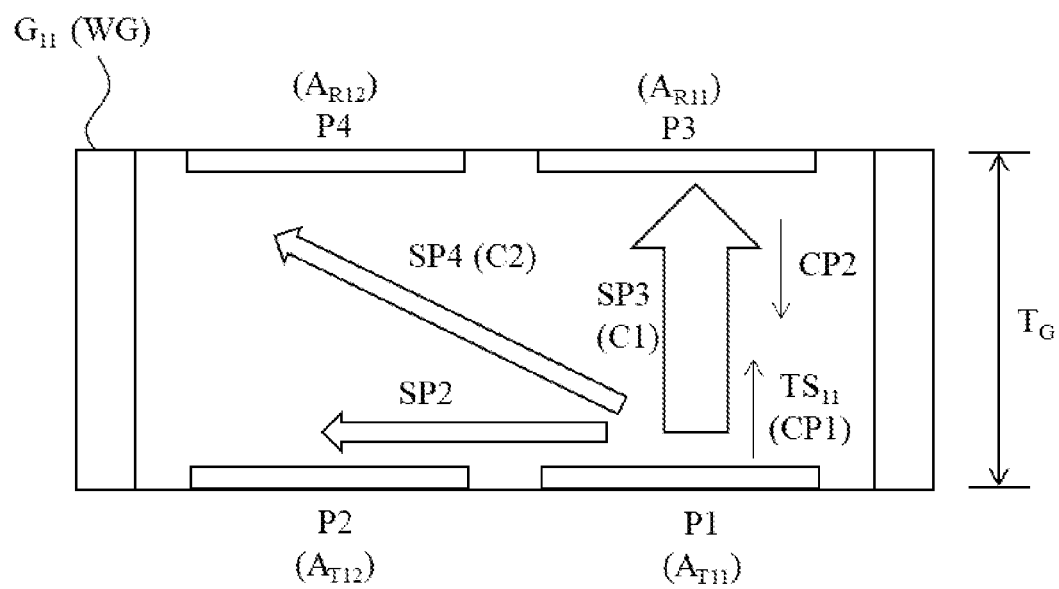
FIG. 5 is a diagram illustrating exemplary signal paths in the test unit shown in FIG. 3A in accordance with some embodiments of the present disclosure.

FIG. 5 is a diagram illustrating exemplary signal paths in the test unit 324 shown in FIG. 3A in accordance with some embodiments of the present disclosure. In the present embodiment, the test unit 324 is arranged to cover/surround/mount the antennas $A_{T11}$ and $A_{T12}$ shown in FIG. 2B to perform near-field coupling. Ports P1-P4 can represent the antennas $A_{T11}$, $A_{T12}$, $A_{R11}$ and $A_{R12}$, respectively. A signal outputted from the port P1 may be sent to the ports P2-P4 through the signal paths SP2-SP4, respectively.

For example, the antenna $A_{R11}$ and the antenna $A_{T11}$ can be placed symmetrically with respect to the grid section $G_{11}$. The antenna $A_{R11}$ is arranged to receive the electromagnetic signal $TS_{11}$ through the signal path SP3 between the antenna $A_{T11}$ and the antenna $A_{R11}$. Additionally, the antenna $A_{R12}$ may receive the electromagnetic signal $TS_{11}$ through the signal path SP4 between the antenna $A_{T11}$ and the antenna $A_{R12}$. The antenna $A_{T12}$ may receive the electromagnetic signal $TS_{11}$ through the signal path SP2 between the antenna $A_{T11}$ and the antenna $A_{T12}$.

When a signal component C2 of the electromagnetic signal $TS_{11}$, which is obliquely incident on the port P4 along the signal path SP4, is small enough, the radiation energy of the antenna $A_{T11}$ can be measured according to a signal component C1 of the electromagnetic signal $TS_{11}$, which is incident on the port P3 along the signal path SP3. For example, when an angle between the signal path SP3 and the signal path SP4 is greater than a predetermined angle such as 80 degrees, the power received at the port P4 would be much lower than that received at the port P3 since the antenna gain at the predetermined angle is quite small. Similarly, as an angle between the signal path SP3 and the signal path SP2 is 90 degrees, the corresponding antenna gain is much smaller than the antenna gain in the direction from the port P1 to the port P3. In the present embodiment, the grid section $G_{11}$ may have a predetermined thickness $T_G$ such that the angle between the signal path SP3 and the signal path SP4 can be greater than the predetermined angle.

In some embodiments, the radiation energy of the antenna $A_{T11}$ can be obtained after a measurement result is calibrated according to the power loss in the signal path SP3. Additionally, or alternatively, bent transmission lines outside the grid section $G_{11}$ may cause a coupling effect on the port P3. Such coupling effect may be omitted since power resulting from the coupling effect is much lower than power transmitted from the port P1.

In some embodiments, when the port P3 is too close to the port P1, part of energy transmitting from the port P1 may be reflected at the port P3. It is worth noting that the antenna $A_{T11}$ may be implemented using a circularly polarized antenna to generate a circularly polarized signal CP1 serving as the electromagnetic signal $TS_{11}$. The direction of circular polarization of the electromagnetic signal $TS_{11}$ can be reversed when the electromagnetic signal $TS_{11}$ is reflected at the port P3, such that a signal reflected from the port P3 may have almost no effect upon the port P1. For example, the antenna $A_{T11}$ may be implemented using a right hand circular polarized (RHCP) antenna. When the circularly polarized signal CP1 is reflected at the port P3, a left hand circular polarized (LHCP) signal, i.e. a circularly polarized signal CP2, can be generated accordingly. The circularly polarized signal CP2 would be rejected by the antenna $A_{T11}$.

The antenna structures described above are provided for illustrative purposes, and are not intended to limit the scope of the present disclosure. In some embodiments, each transmitter antenna and/or each receiver antenna can be implemented using various types of antennas, such as single-feed antennas, dual-feed antennas and quarter-wavelength patch antennas, without departing from the scope of the present disclosure. In some embodiments, each transmitter antenna and/or each receiver antenna can be implemented using a rectangular patch antenna, a circular patch antenna, an elliptical patch antenna, a truncated patch antenna, or a patch antenna with a different shape without departing from the scope of the present disclosure. In some embodiments, the antennas $A_{R11}$ and $A_{R12}$ shown in FIG. 3A may be replaced with a single antenna or a signal receiving circuit as long as the grid section $G_{11}$ can be used together with the antenna or the signal receiving circuit to form a shell capable of covering the antennas $A_{T11}$ and $A_{T12}$.

Figure 6A:
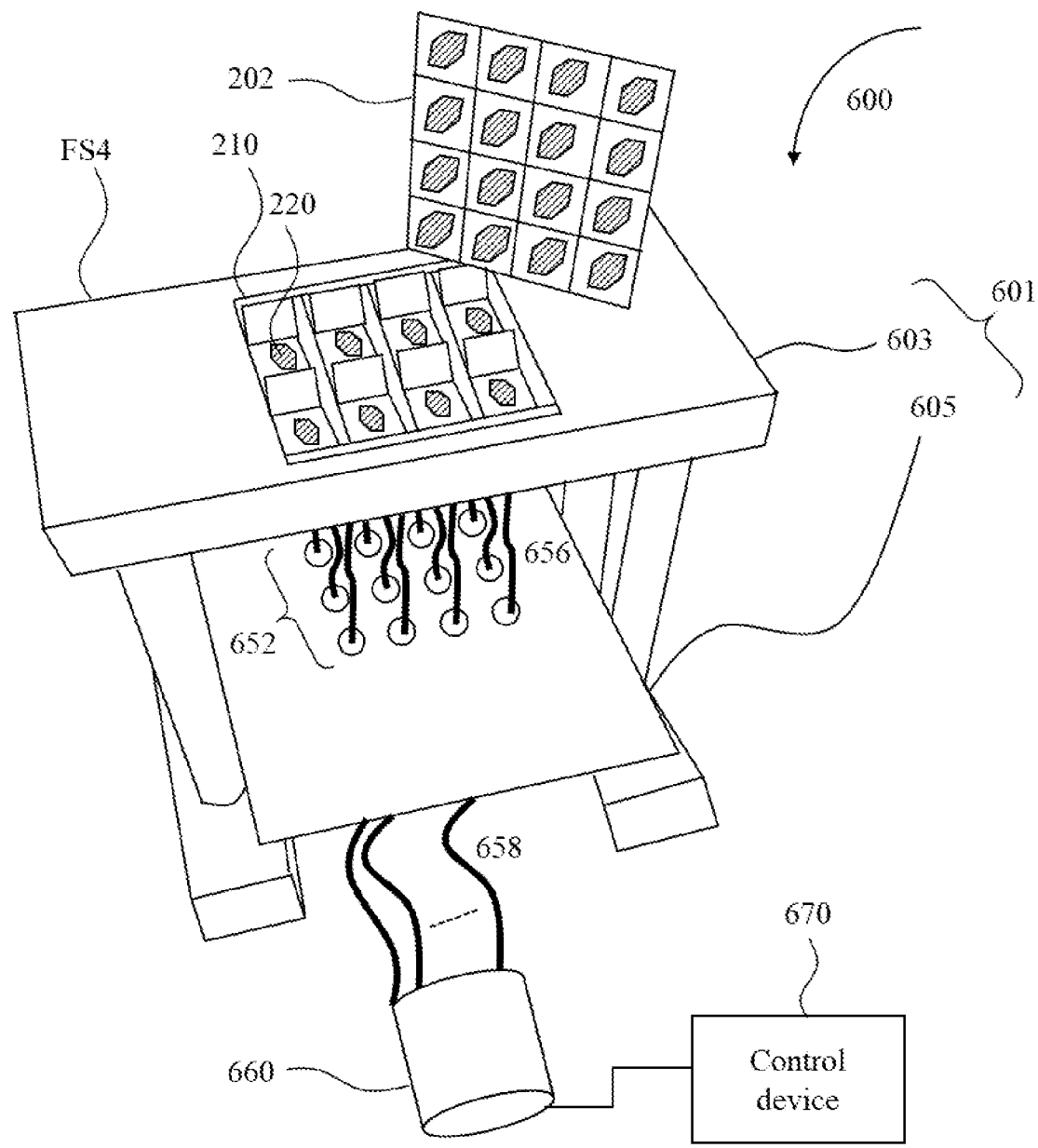
FIG. 6A illustrates an exemplary near-field testing apparatus in accordance with some embodiments of the present disclosure.

FIG. 6A illustrates an exemplary near-field testing apparatus in accordance with some embodiments of the present disclosure. In the present embodiment, the near-field testing apparatus 600 can be implemented to include a test platform for receiving the DUT 202 shown in FIG. 2B. In addition to the frame structure 210 and the receiver circuit 220, the near-field testing apparatus 600 may include a test stand 601, a plurality of connectors 652, a plurality of cables 656 and 658, a switch device 660 and a control device 670.

Figure 6B:
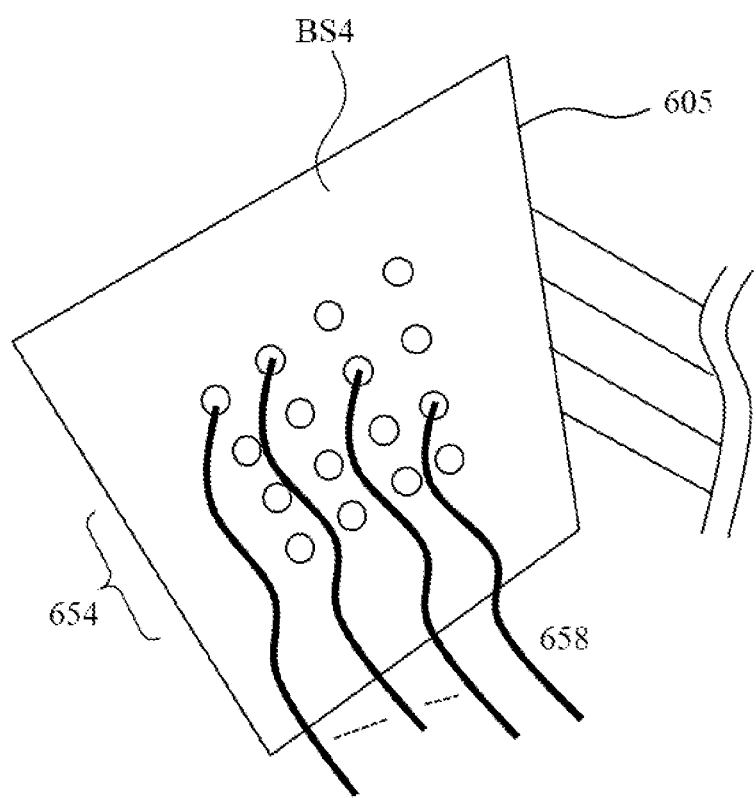
FIG. 6B is a diagram illustrating a plurality of connectors formed on a backside of the lower board shown in FIG. 6A in accordance with some embodiments of the present disclosure.

The test stand 601 includes an upper board 603 and a lower board 605. The frame structure 210 and the receiver circuit 220 can be installed or embedded in the upper board 603. The receiver jig 203 shown in FIG. 2B can be placed at a backside of the upper board 603 (not shown in FIG. 6A). The lower board 605 is used to carry the connectors 652 at a frontside FS4 thereof, and to carry a plurality of connectors 654 shown in FIG. 6B at a backside BS4 thereof. Referring to FIG. 6A and FIG. 6B, the connectors 652 are electrically connected to the connectors 654, respectively. One or more of the connectors 652 and 654 can be implemented using an SMA (Sub-Miniature Series A) connector. It is worth noting that the connectors 654 can be installed or embedded in the lower board 605. As a result, when the cables 658 are frequently plugged into and unplugged from the connectors 654 in the testing process, the push-on and push-off forces can be applied on the lower board 605 instead of welding surfaces of the connectors 654, thus alleviating damage on the welding surfaces.

In addition, the cables 656 are arranged to establish connection between the receiver circuit 220 and the connectors 652. The cables 658 are arranged to establish connection between the switch device 660 and the connectors 654. The switch device 660, coupled to the receiver circuit 220, can be arranged to select one or more antenna in the array of antennas 224 and accordingly output one or more receiver signals generated by the selected one or more antennas. In the present embodiment, one cable 656, one connector 652, one connector 654 and one cable 658 which are electrically connected in series can be regarded as one channel. The switch device 660 can be regarded as being coupled to the receiver circuit 220 through sixteen channels. The control device 670, coupled to the switch device 660, is configured to control switch operation of the switch device 660.

FIG. 7A is a block diagram representation of the near-field testing apparatus 600 shown in FIG. 6A used in the calibration process in accordance with some embodiments of the present disclosure. The testing jig 710 can represent the frame structure 210 and the receiver circuit 220 shown in FIG. 6A at least. The transmission link 752 may include a portion of the sixteen channels shown in FIG. 6A, and the transmission link 754 may include another portion of the sixteen channels shown in FIG. 6A. In the present embodiment, each of transmission links 752 and 754 may have eight channels.

The switch circuits 762 and 764 can serve as an embodiment of the switch device 660 shown in FIG. 6A. In the present embodiment, the switch circuit 762 includes eight input ports and an output port. The eight input ports are coupled to the channels CH1-CH8, respectively. The switch circuit 762 can be arranged to couple one of the channels CH1-CH8 to the channel CHX coupled to the output port. Similarly, the switch circuit 764 can be arranged to couple one of the channels CH9-CH16 to the channel CHY.

The control circuits 772 and 774 can serve as an embodiment of the control device 670 shown in FIG. 6A. The control circuit 772 is configured to control switch operation of the switch circuit 762. The control circuit 774 is configured to control switch operation of the switch circuit 764. In some embodiments, each of the control circuits 772 and 774 can be automatically controlled by software executing on a computer.

In operation, calibration planes are determined. For example, when the near-field testing apparatus 700 is used for power measurement calibration, network analyzer (NA) calibration planes 782 and 784 are determined. As another example, when the near-field testing apparatus 700 is used for phase measurement calibration, the NA calibration planes 782 and 786 are determined. In addition, path(s) to be calibrated are determined. The power/phase measurement calibration is performed by an NA 790, which is coupled to an input port $P_{IN}$ and an output port $P_{OUT}$. A calibration module 702 is received within the testing jig 710 and coupled to the NA 790. The calibration module 702 can be implemented as 1×2 antennas shown in FIG. 7B. In the present embodiment, the calibration module 702 can be put into or attached to grid sections included in the testing jig 710 one at a time. For example, the calibration module 702 can be put into the grid section $G_{11}$ shown in FIG. 2B to produce a group of receiver signals, put into the grid section $G_{12}$ shown in FIG. 2B to produce another group of receiver signals, and so on. Each time a group of receiver signals is produced, the transmission loss and phase caused by the testing jig 710, the transmission link 752/754, the switch circuit 762/764 and a receiver of the NA 790 can be recorded. In addition, the NA 790 may calibrate signals on the NA calibration planes 782 and 784.

Figure 8:
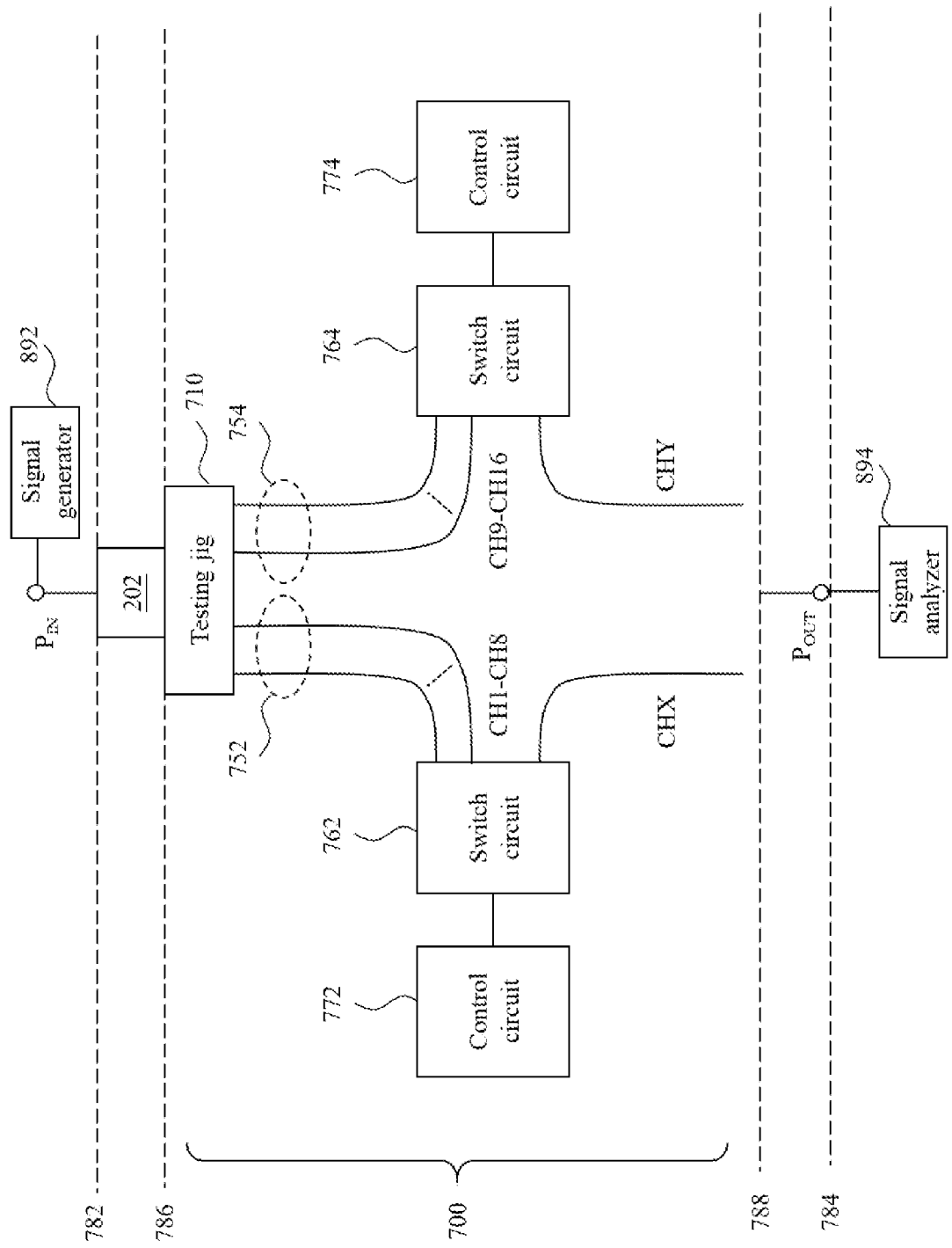
FIG. 8 is a block diagram representation of the near-field testing apparatus shown in FIG. 6A used in the testing process in accordance with some embodiments of the present disclosure.

FIG. 8 is a block diagram representation of the near-field testing apparatus 600 shown in FIG. 6A used in the testing process in accordance with some embodiments of the present disclosure. In the present embodiment, the input port $P_{IN}$ is coupled to a signal generator 892, and the output port $P_{OUT}$ is coupled to a signal analyzer 894. As those skilled in the art can appreciate the operation of the near-field testing apparatus 700 in the testing process, where the DUT 202 is received within the near-field testing apparatus 700, after reading the above paragraphs directed to FIG. 1 through FIG. 7B, repeated description is omitted here for brevity.

To calibrate signals on the transmitter (TX) output power plane 788, further calculations may be performed. For example, because of the rotating-element electric-field vector (REV) effect, the calibration of the phase on the TX output power plane 788 may be performed together with far-field testing. In the present embodiment, the near-field testing apparatus 700 can implement near-field test operation, which can reduce/eliminate over-the-air (OTA) path loss produced in near-field test operation. As a result, the difference between the measurement result of the near-field test operation and the measurement result of the far-field test operation can be obtained. With the use of a number of sampling operations and verifications, the REV effect can be derived according to the obtained difference. The precise relative phases can be obtained accordingly.

Figure 9:
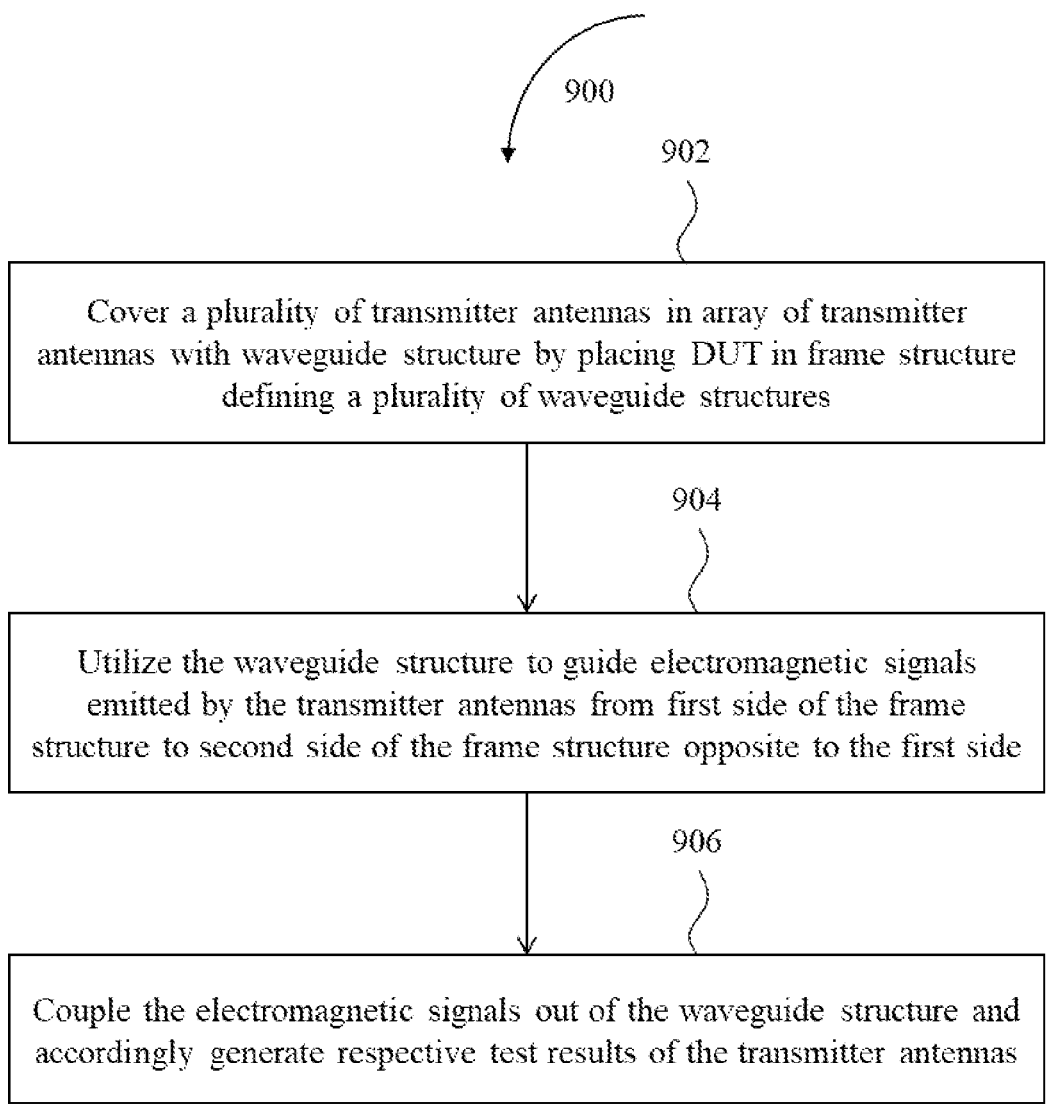
FIG. 9 is a flow chart of an exemplary method for testing a device under test having an array of transmitter antennas in accordance with some embodiments of the present disclosure.

FIG. 9 is a flow chart of an exemplary method for testing a DUT having an array of transmitter antennas in accordance with some embodiments of the present disclosure. For illustrative purposes, the method 900 is described below with reference to the near-field testing apparatus 200 shown in FIG. 2B. It is worth noting that the method 900 can be employed in the near-field testing apparatus 600 shown in FIG. 6A, the near-field testing apparatus 700 shown in FIG. 7A or the near-field testing apparatus 700 shown in FIG. 8 without departing from the scope of the present disclosure. Additionally, in some embodiments, other operations in the method 900 can be performed. In some other embodiments, operations of the method 900 can vary.

At operation 902, a plurality of transmitter antennas in the array of transmitter antennas are covered with a waveguide structure by placing the DUT in a frame structure, which defines a plurality of waveguide structures. For example, the frame structure 210 can define a plurality of waveguide structure extending parallel to each other, such as waveguide structures implemented using the grid sections $G_{11}$-$G_{42}$. By placing the DUT 202 in the frame structure 210, an end of the waveguide structure WG is attached to the DUT 202. The antennas $A_{T11}$ and $A_{T12}$ are covered with the waveguide structure WG at the end.

At operation 904, the waveguide structure is utilized to guide electromagnetic signals emitted by the transmitter antennas from a first side of the frame structure to a second side of the frame structure opposite to the first side. For example, the waveguide structure WG can guide each of the electromagnetic signals $TS_{11}$ and $TS_{12}$ from the side FS1 to the side BS1.

At operation 906, the electromagnetic signals are coupled out of the waveguide structure, and respective test results of the transmitter antennas are generated accordingly. For example, the receiver circuit 220 can couple the electromagnetic signals $TS_{11}$ and $TS_{12}$ out of the waveguide structure WG, and accordingly generate the receiver signals $RS_{11}$ and $RS_{12}$. Circuit(s) in a next stage, such as the signal analyzer 894 shown in FIG. 8, may generate a test result of the antenna $A_{T11}$ according to the receiver signal $RS_{11}$, and generate a test result of the antenna $A_{T12}$ according to the receiver signal $RS_{12}$.

In some embodiments, at operation 902, a ground plane structure where the array of transmitter antennas is disposed is attached to the waveguide structure. For example, the ground plane structure 207 can be attached to the cladding region $R_C$ of the waveguide structure WG at the side FS1. The antennas $A_{T11}$ and $A_{T12}$ are surrounded by and separated from the cladding region $R_C$ at the side FS1.

In some embodiments, at operation 906, a plurality of receiver antennas disposed at the second side of the frame structure are utilized to receive the electromagnetic signals. For example, the antennas $A_{R11}$ and $A_{R12}$ disposed at the side BS1 can be utilized to receive the electromagnetic signals $TS_{11}$ and $TS_{12}$. The antennas $A_{R11}$ and $A_{R12}$ and the antennas $A_{T11}$ and $A_{T12}$ can be placed symmetrically with respect to the waveguide structure WG.

In some embodiments, a length of the waveguide structure WG in a direction from one end to an opposite end may be short enough so that an angle between a signal path from the antenna $A_{T11}$ to the antenna $A_{R11}$ and a signal path from the antenna $A_{T11}$ to the antenna $A_{R12}$ can be greater than a predetermined angle. When the angle between the two signal paths is greater than the predetermined angle, radiation energy of the antenna $A_{T11}$ may be transmitted mainly to the antenna $A_{R11}$. In some embodiments, the antenna $A_{T11}/A_{T12}$ may be implemented using a circularly polarized antenna configured to generate a circularly polarized signal, which serve as the electromagnetic signal $TS_{11}/TS_{12}$. When the length of the waveguide structure WG is short such that a portion of electromagnetic signal $TS_{11}/TS_{12}$ is reflected by the antenna $A_{R11}/A_{R12}$, the reflected signal can be rejected by the circularly polarized antenna.

As those skilled in the art can appreciate the operation of the method 900 after reading the above paragraphs directed to FIG. 1 through FIG. 8, further description is omitted here for brevity.

With the use of the proposed testing scheme, an array of antennas can be tested using near-field coupling operation which can reduce/eliminate OTA path loss produced in near-field test operation. An array of shells can be provided to reduce energy leakage and interference between different antennas. In addition, the proposed testing scheme can speed up the process of testing an antenna module by testing one group of subunits at a time.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A near-field testing apparatus for testing a device under test (DUT) having an array of transmitter antennas, the near-field testing apparatus comprising:
   a frame structure defining an array of grid sections, the frame structure being arranged for receiving the DUT at a first side of the array of grid sections, wherein when the DUT is received at the first side of the array of grid sections, the array of grid sections is attached to a substrate where the array of transmitter antennas is disposed, and a periphery of each grid section at the first side is attached to the substrate and arranged to surround a plurality of transmitter antennas in the array of transmitter antennas; the grid section is arranged to guide respective electromagnetic signals emitted by the transmitter antennas from the first side to a second side of the array of grid sections; and
   a receiver circuit, disposed at the second side of the array of grid sections, the receiver circuit being arranged to couple the electromagnetic signals out of the grid section.

2. The near-field testing apparatus of claim 1, wherein the periphery of the grid section is arranged to surround two adjacent transmitter antennas arranged in a row direction or a column direction.

3. The near-field testing apparatus of claim 1, wherein the grid section comprises:
   a first opening, formed at the first side, the first opening being arranged to mount the transmitter antennas;
   a second opening, formed at the second side, the second opening being arranged to mount a plurality of receiver antennas of the receiver circuit; and
   a guiding region, configured to be a hollow core region of a hollow waveguide structure between the first opening and the second opening, the guiding region being arranged to transmit the electromagnetic signals in a form of standing wave from the first opening to the second opening.

4. The near-field testing apparatus of claim 1, wherein the frame structure comprises a plurality of intersecting side walls arranged to define the array of grid sections; a group of side walls arranged to define the grid section has conductive surfaces facing each other.

5. The near-field testing apparatus of claim 1, wherein the array of transmitter antennas is disposed on a ground plane structure; the frame structure comprises a plurality of intersecting side walls arranged to define the array of grid sections; at least one of the side walls is in contact with the ground plane structure, and each of the side walls is separated from the transmitter antennas.

6. The near-field testing apparatus of claim 1, wherein the receiver circuit comprises:
   an array of receiver antennas, disposed in correspondence with the array of transmitter antennas, wherein a periphery of the grid section at the second side surrounds a plurality of receiver antennas in the array of receiver antennas.

7. The near-field testing apparatus of claim 6, wherein the receiver antennas are two adjacent receiver antennas arranged in a row direction or a column direction.

8. The near-field testing apparatus of claim 6, wherein the receiver antennas comprise:
   a first receiver antenna, wherein the first receiver antenna and a transmitter antenna included in the transmitter antennas are placed symmetrically with respect to the grid section; the first receiver antenna is arranged to receive the electromagnetic signal emitted by the transmitter antenna through a first signal path between the transmitter antenna and the first receiver antenna; and
   a second receiver antenna adjacent to the first receiver antenna, wherein the second receiver antenna is arranged to receive the electromagnetic signal through a second signal path between the transmitter antenna and the second receiver antenna; an angle between the first signal path and the second signal path is greater than 80 degrees.

9. A near-field testing grid, comprising:
   a first opening, configured to mount a plurality of transmitter antennas, wherein an edge of the first opening is arranged to contact a substrate where the transmitter antennas are disposed to thereby surround the transmitter antennas;
   a second opening, configured to mount a plurality of receiver antennas; and
   a guiding region, configured to be a hollow core region of a hollow waveguide structure between the first opening and the second opening, the guiding region being arranged to guide respective electromagnetic signals emitted by the transmitter antennas to the receiver antennas, wherein the electromagnetic signals are transmitted in a form of standing wave in the hollow waveguide structure.

10. The near-field testing grid of claim 9, wherein the second opening is opposite to the first opening.

11. The near-field testing grid of claim 9, wherein the transmitter antennas comprise two adjacent transmitter antennas arranged in a row direction or a column direction, and the receiver antennas comprise two adjacent receiver antennas arranged in the row direction or the column direction.

12. The near-field testing grid of claim 9, wherein the first opening and the second opening are configured to mount the transmitter antennas and the receiver antennas such that the transmitter antennas are directly opposite to the receiver antennas in the hollow waveguide structure respectively.

13. The near-field testing grid of claim 9, wherein the hollow waveguide structure is a rectangular hollow structure, the first opening is a first rectangular opening, and the second opening is a second rectangular opening opposite to the first rectangular opening.

14. The near-field testing grid of claim 13, wherein an inner height of the rectangular hollow structure is equal to a half wavelength of at least one of the electromagnetic signals, and an inner width of the rectangular hollow structure is equal to a wavelength of the at least one of the electromagnetic signals.

15. The near-field testing grid of claim 13, wherein the transmitter antennas comprise two adjacent transmitter antennas arranged in a first row with a first rectangular shape, and an area of the first rectangular shape is not greater than an area of the first rectangular opening; the receiver antennas comprise two adjacent receiver antennas arranged in a second row with a second rectangular shape, and an area of the second rectangular shape is not greater than an area of the second rectangular opening; the first rectangular opening is configured to be mount the first row, and the second rectangular opening is configured to be mount the second row.

16. A method for testing a device under test (DUT) having an array of transmitter antennas, the method comprising:
covering a plurality of transmitter antennas in the array of transmitter antennas with a waveguide structure by placing the DUT in a frame structure defining a plurality of waveguide structures, wherein the waveguide structure extends from a first side of the frame structure to a second side of the frame structure opposite to the first side, and an edge of an opening of the waveguide structure at the first side is arranged to contact a substrate where the transmitter antennas are disposed to thereby surround the transmitter antennas;
utilizing the waveguide structure to guide electromagnetic signals emitted by the transmitter antennas from the first side to the second side; and
coupling the electromagnetic signals out of an opening of the waveguide structure at the second side and accordingly generate respective test results of the transmitter antennas.

17. The method of claim 16, wherein the transmitter antennas comprise two adjacent transmitter antennas arranged in a row direction or a column direction.

18. The method of claim 16, wherein coupling the electromagnetic signals out of the waveguide structure comprises:
utilizing a plurality of receiver antennas disposed at the second side of the frame structure to receive the electromagnetic signals, wherein the receiver antennas and the transmitter antennas are placed symmetrically with respect to the waveguide structure.

19. The method of claim 16, wherein the array of transmitter antennas is disposed on a ground plane structure; the waveguide structure comprises a guiding region and a cladding region surrounding the guiding region; covering the transmitter antennas with the waveguide structure by placing the DUT in the frame structure comprises:
attaching the ground plane structure to the cladding region at the first side of the frame structure, wherein the transmitter antennas are surrounded by and separated from the cladding region at the first side.

20. The method of claim 16, further comprising:
utilizing the transmitter antennas to emit circularly polarized signals, the circularly polarized signals serving as the electromagnetic signals, respectively.

* * * * *